United States Patent
Gauthier, Jr. et al.

(10) Patent No.: US 6,352,905 B1
(45) Date of Patent: Mar. 5, 2002

(54) METHOD AND STRUCTURE OF HIGH AND LOW K BURIED OXIDE FOR SOI TECHNOLOGY

(75) Inventors: Robert J. Gauthier, Jr., Hinesburg, VT (US); Dominic J. Schepis, Wappingers falls, NY (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/702,787

(22) Filed: Nov. 1, 2000

Related U.S. Application Data

(62) Division of application No. 09/526,369, filed on Mar. 16, 2000, now Pat. No. 6,166,420.

(51) Int. Cl.$^7$ ................................................ H01L 21/76
(52) U.S. Cl. ....................... 438/404; 438/405; 438/406
(58) Field of Search ................................ 438/404, 406, 438/412, 413, 439, 691, 692, 405, 778, 787, 791, 149–155, 162–164; 257/758, 640, 643

(56) References Cited

U.S. PATENT DOCUMENTS

| | | | |
|---|---|---|---|
| 4,733,482 A | | 3/1988 | West et al. ................ 357/23.5 |
| 5,587,604 A | | 12/1996 | Machesney et al. ......... 257/350 |
| 5,670,388 A | | 9/1997 | Machesney et al. .......... 437/21 |
| 5,708,303 A | * | 1/1998 | Jeng ............................ 257/758 |
| 5,777,365 A | * | 7/1998 | Yamaguchi et al. ......... 257/347 |
| 5,789,818 A | * | 8/1998 | Havemann .................. 257/750 |
| 5,858,471 A | | 1/1999 | Ray et al. .................... 427/524 |
| 5,869,386 A | | 2/1999 | Hamajima et al. .......... 438/455 |
| 5,888,854 A | * | 3/1999 | Morihara ..................... 438/155 |
| 5,998,840 A | * | 12/1999 | Kim ............................ 257/349 |
| 6,063,652 A | * | 5/2000 | Kim ............................ 438/155 |

OTHER PUBLICATIONS

Publication entitled "CMOS–on–SOI ESD Protection Networks, " by S. Voldman et al., Reprinted from Journal of Electrostatics 42 (1998), pp. 333–350.

Publication entitled "Dynamic Threshold Body–and Gate–Coulped SOI ESD Protection Networks," by S. Voldman et al, Reprinted from Journal of Electrostatics 44 (1998), pp. 239–255.

Elsevier Science Ltd. Publication entitled "The Impact of MOSFET Technology evolution and Scaling on Electrostatic discharge protection," by S. Voldmanm microelectronics Reliability 38 (1998), pp. 1649–1668.

IEEE Publication–ISSCC 99/Session 25/SOI Microprocessors and Memory/Paper WP 25.2, SOI Technology Performan and Modeling by J. Pelloie et al., pp. 364–365; 428–429, (1999).

IEEE Publications–ISSCC 99/Session 25/SOI Microprocessors and Memory/Paper WP 25.1 Partially–Depleted SOi Technology for Digital Logic, by G. Shjahidi et al., pp. 362–636; 426–427, (1999).

* cited by examiner

Primary Examiner—Olik Chaudhuri
Assistant Examiner—Theresa T. Doan
(74) Attorney, Agent, or Firm—McGinn & Gibb, PLLC; Richard A. Henkler, Esq.

(57) ABSTRACT

A method and structure for forming an integrated circuit wafer comprises forming a substrate having first and second portions, depositing a first insulator over the substrate, patterning the first insulator such that the first insulator remains only over the first portion, depositing a second insulator over substrate (the first insulator has different thermal dissipation characteristics than the second insulator), polishing the second insulator to form a planar surface, and attaching a silicon film over the first insulator and the second insulator.

20 Claims, 2 Drawing Sheets

METHOD AND STRUCTURE OF HIGH AND LOW K BURIED OXIDE FOR SOI TECHNOLOGY

This application is a division of U.S. application Ser. No. 09/526,369, filed on Mar. 16, 2000 now U.S. Pat. No. 6,166,420.

BACKGROUND OF THE INVENTION

1. Field of the Invention

The present invention generally relates to integrated circuits and more specifically to an insulator that simultaneously dissipates heat from high power devices using a high K insulator material and accommodates the low electrical permitivity/resistance needs of low power logic devices using a low K insulator material.

2. Description of the Related Art

With the advent of high performance/low power integrated circuit devices, low K dielectrics are commonly used to insulate the devices from adjacent substrates. Low K dielectrics offer reduced electrical permitivity and reduced thermal resistance when compared to high K dielectrics. While such electrical characteristics are very beneficial to low-power devices (such as critical paths, logic chains and other core logic devices), the low K dielectrics do not offer the high thermal conductivity which is required by high-power devices, such as electrostatic discharge (ESD) devices, clock buffers, and input/output (I/O) drivers.

Therefore, the integrated circuit designer must balance the electrical needs of the low-power devices against the thermal needs of the high power devices. This compromise reduces the performance of the low-powered devices and constrains the amount of heat which can be generated by the high-power devices. The invention described below eliminates this tradeoff and allows the integrated circuit designer to improve the performance of the low-powered devices and, at the same time, allows the high-powered devices to generate additional heat. Thus, the invention overcomes self heating of ESD structures, interconnects and circuits.

SUMMARY OF THE INVENTION

It is, therefore, an object of the present invention to provide an integrated circuit wafer that includes a substrate having first and second portions, a first insulator over the first portion, a second insulator over the second portion (wherein the first insulator has different thermal dissipation characteristics than the second insulator), and a silicon film over the first insulator and the second insulator.

The first insulator has higher thermal dissipation than the second insulator and the first insulator has a higher dielectric constant than the second insulator. The substrate includes first devices over the first insulator and second devices over the second insulator. The first devices generate more heat than the second devices, and the second devices require higher electrical permitivity than the first devices.

The first insulator and the second insulator could be adjacent one another and form a single planar surface upon which the silicon film is positioned. Alternatively, the first insulator could be positioned within the second insulator, adjacent the silicon film or the first insulator could be positioned within the second insulator, adjacent the substrate.

The invention also includes a method of forming an integrated circuit wafer that comprises forming a substrate having first and second portions, depositing a first insulator over the substrate, patterning the first insulator such that the first insulator remains only over the first portion, depositing a second insulator over substrate (the first insulator has different thermal dissipation characteristics than the second insulator), polishing the second insulator to form a planar surface, and attaching a silicon film over the first insulator and the second insulator.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

The invention overcomes the limitations of conventional structures discussed above by selectively forming dielectrics having different dielectric constants "K" depending upon whether the insulator will be adjacent low-powered devices or high-powered devices. More specifically, the invention forms a single insulator layer that includes a region of high K dielectric adjacent high-powered devices and a region of low K dielectric adjacent low-power, high-performance devices.

Figure 1:
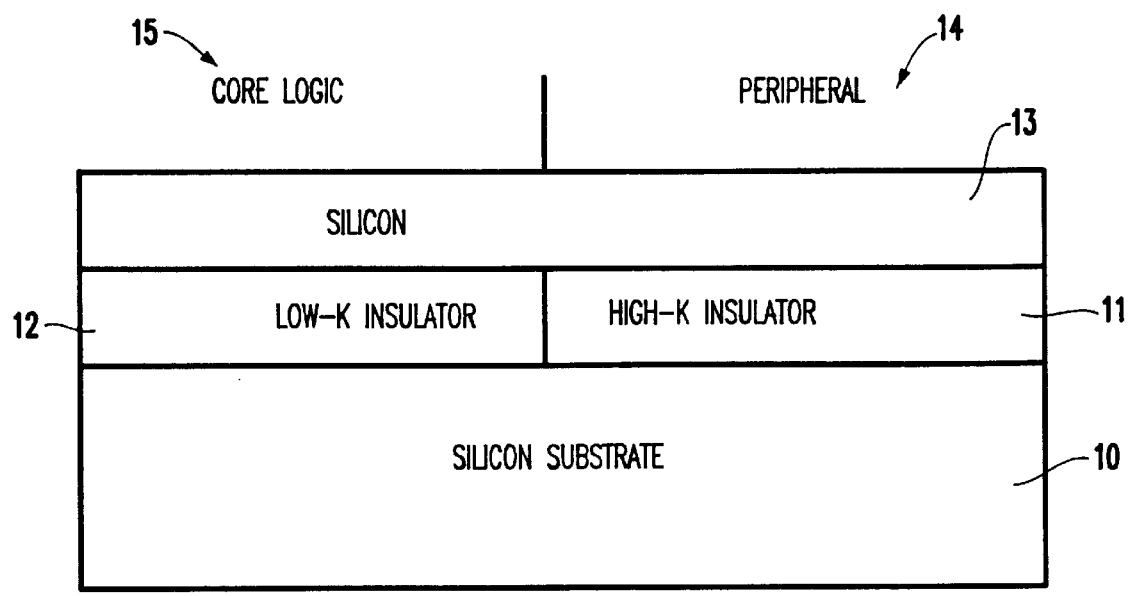
FIG. 1 is a schematic diagram of a cross-sectional view of an integrated circuit wafer according to the invention.

A first embodiment of the invention is shown in FIG. 1. The structure shown in FIG. 1 begins with the formation of a substrate 10, such as a silicon substrate. Then a layer of high K dielectric material 11 is deposited over the silicon substrate 10. The high K dielectric 11 can comprise any dielectric that has an elevated dielectric constant K when compared to the low K dielectric 12. For example, the high K dielectric 11 can comprise $SiO_2$, etc., and the low K dielectric 12 can comprise HSQ (hydosilsesque oxane, aka FOX), Nanoporous silica, Poly (arylene) ether, Aromatic hydrocarbon, hybrid-S2, etc. The invention is not limited to the materials discussed here but, as would be known by one ordinarily skilled in the art given this disclosure, any similar dielectric can be substituted for the high or low K dielectric.

The high K dielectric is patterned using conventional masking and etching techniques. Then the low K dielectric 12 is deposited. The structure is then polished to make the upper surfaces of the high K dielectric 11 and the dielectric 12 level (e.g., to form a planar surface). A layer of silicon 13 is attached to the upper surface of the dielectrics 11, 12. The high K dielectric is patterned such that high-power peripheral devices such as ESD networks, I/O drivers, buffers, receivers capacitors, etc. are above the high K dielectric 11 and so that low-power, high performance devices such as core logic, memory circuits etc. will be over the low K dielectric 12. The peripheral devices and core logic would be within the same silicon layer 13. In an alternative embodiment, the low K dielectric can be deposited first and patterned and then the low K dielectric can fill in the remaining pattern.

The inventive structure is superior to conventional structures that use a single homogeneous insulator layer because the inventive multi-K dielectric insulator layer allows the core logic to take advantage of the reduced electrical permitivity associated with the low K dielectric insulator 12 while at the same time taking advantage of the increased heat transfer capability (e.g., heat dissipation) of the high K dielectric insulator 11.

For example, the high K dielectric insulator may have a thermal characteristics of 0.014 W/C-cm while the low K dielectric would have a thermal characteristics of 0.0037 W/C-cm, which is approximately a five factor reduction in thermal K when going from the high dielectric to the low dielectric (considering $SiO_2$ and FOX as the high dielectric and low of dielectrics insulators, respectively). Similarly, again considering $SiO_2$ as the high K dielectric insulator and FOX as the low K dielectric insulator, the dielectric constants are 3.9 and 2.9, respectively which represents an approximately 25 percent reduction in the dielectric constant when going from the high K dielectric to the low K dielectric.

Figure 2:
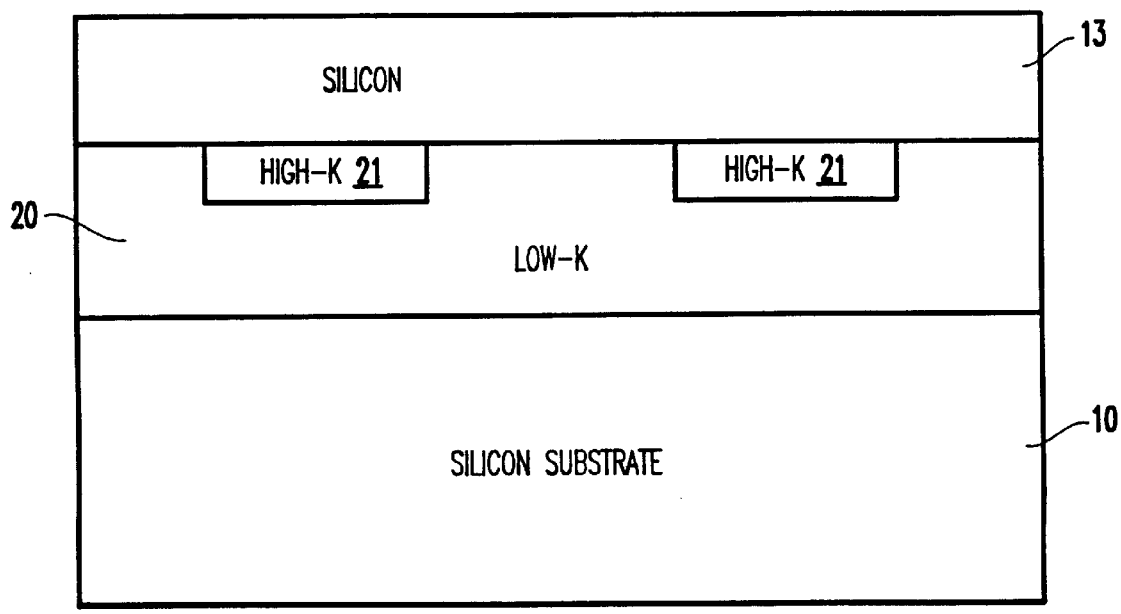
FIG. 2 is a schematic diagram of a cross-sectional view of an integrated circuit wafer according to the invention.
Figure 3:
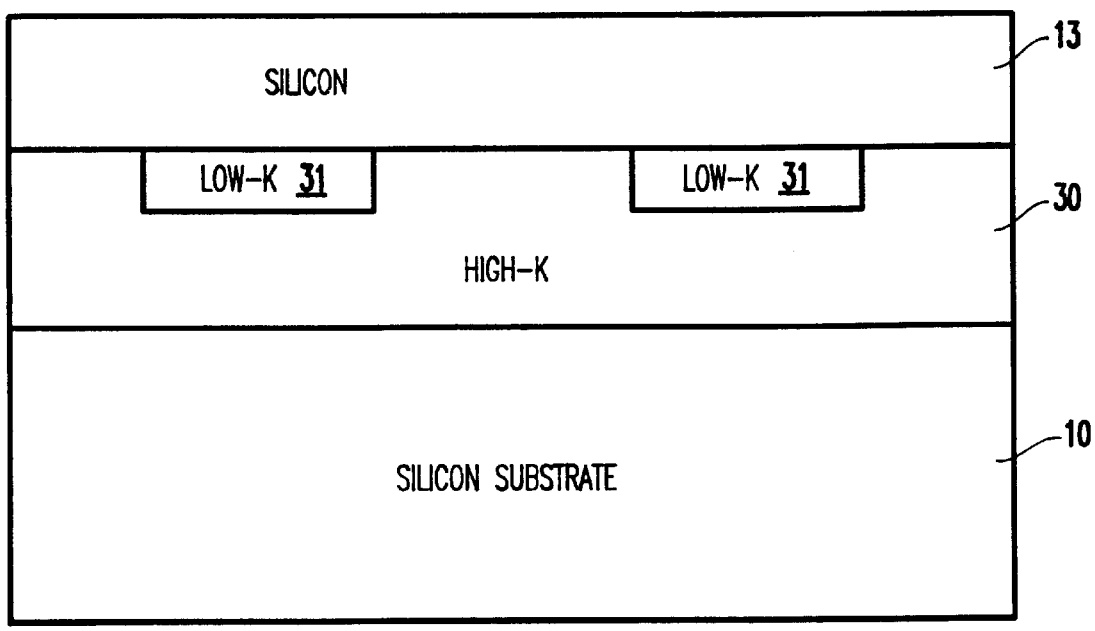
FIG. 3 is a schematic diagram of a cross-sectional view of an integrated circuit wafer according to the invention.

FIG. 2 illustrates another embodiment of the invention where the low K dielectric 20 is deposited first and pattern and the high K dielectric 21 is deposited in the pattern openings. As with the structure discussed in FIG. 1, the structure in FIG. 2 is polished before the silicon 13 and other associated peripheral in the core logic structures are attached. FIG. 3 is similar to the structure shown in FIG. 2 except that the high K dielectric 30 is deposited first and patterned and the low K dielectric 31 is used to fill in the pattern openings. Peripheral logic typically needs to dissipate heat whereas the core logic requites the low dielectric for improved performance advantage. Thus, FIG. 2 shows high k under the circuits with preferred heat dissipation, and FIG. 3 shows low-k under performance based devices.

Figure 4:
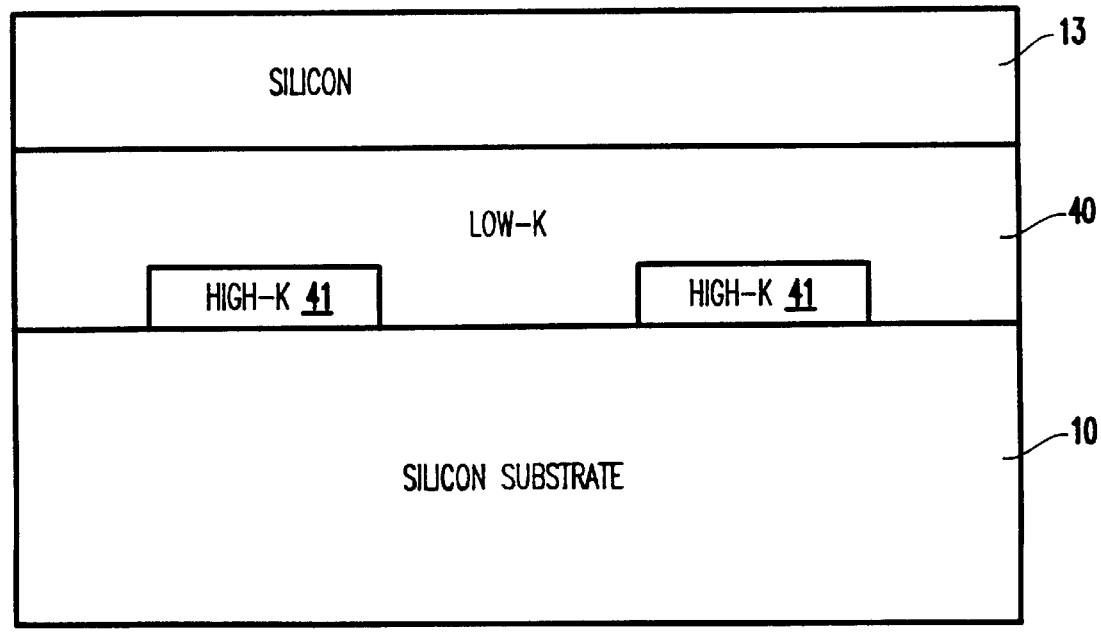
FIG. 4 is a schematic diagram of a cross-sectional view of an integrated circuit wafer according to the invention.

FIG. 4 illustrates another embodiment of the invention where the high K dielectric 41 is deposited on the silicon substrate 10 and patterned. Then the low K dielectric 40 is deposited to completely cover the high K dielectric 41 and to extend a certain thickness above the high dielectric 41. When the low K dielectric 40 is planarized, a portion of the low K dielectric 40 is allowed to remain over the high K dielectric 41. As would be known by one ordinarily skilled in the art given this disclosure, the high and low K dielectrics can be switched in this example. In this embodiment, the low k is under all elements, and the thermal resistance is reduced by using a shorter depth of low k material.

While the invention has been described in terms of preferred embodiments, those skilled in the art will recognize that the invention can be practiced with modification within the spirit and scope of the appended claims.

What is claimed is:

1. A method of forming a silicon-over-insulator (SOI) integrated circuit structure comprising:

forming a substrate having first and second portions;

depositing a first insulator over said substrate;

patterning said first insulator such that said first insulator remains only over said first portion;

depositing a second insulator over said substrate, wherein said first insulator has different thermal dissipation characteristics than said second insulator;

polishing said first insulator and said second insulator to form a planar surface; and attaching a silicon film over said first insulator and said second insulator, such that said silicon film is separated from said substrate only by said first and second insulators.

2. The method in claim 1, wherein said first insulator has a different dielectric constant than said second insulator.

3. The method in claim 1, wherein said first insulator has higher thermal dissipation than said second insulator and said first insulator has a higher dielectric constant than said second insulator, and said method further comprising forming first devices in said silicon film over said first insulator and second devices in said silicon film over said second insulator, wherein said first devices generate more heat than said second devices, and said second devices require higher electrical permitivity than said first devices.

4. The method in claim 1, wherein said first insulator is patterned such that said first insulator and said second insulator are formed adjacent one another and said polishing forms a single planar surface upon which said silicon film is positioned.

5. The method in claim 1, wherein said first insulator is patterned such that said first insulator is positioned within said second insulator, adjacent said silicon film.

6. The method in claim 1, wherein said first insulator is patterned such that said first insulator is positioned within said second insulator, adjacent said substrate.

7. The method in claim 1, wherein said first insulator and said second insulator form an insulating layer that electrically isolates said substrate from said silicon film.

8. A method of forming a silicon-over-insulator (SOI) integrated circuit structure comprising:

depositing a first insulator over a substrate;

patterning said first insulator to create openings;

depositing a second insulator in said openings, wherein said first insulator has different thermal dissipation characteristics than said second insulator;

polishing said first insulator and said second insulator to form a planar surface; and attaching a silicon film over said first insulator and said second insulator.

9. The method in claim 8, wherein said first insulator has a different dielectric constant than said second insulator.

10. The method in claim 8, wherein said first insulator has higher thermal dissipation than said second insulator and said first insulator has a higher dielectric constant than said second insulator, and said method further comprising forming first devices in said silicon film over said first insulator and second devices in said silicon film over said second insulator, wherein said first devices generate more heat than said second devices, and said second devices require higher electrical permitivity than said first devices.

11. The method in claim 8, wherein said second insulator has higher thermal dissipation than said first insulator and said second insulator has a higher dielectric constant than said first insulator, and said method further comprising forming first devices in said silicon film over said first insulator and second devices in said silicon film over said second insulator, wherein said first devices generate more heat than said second devices, and said second devices require higher electrical permitivity than said first devices.

12. The method in claim 8, wherein said polishing forms a single planar surface upon which said silicon film is positioned.

13. The method in claim 8, wherein said first insulator is patterned such that said first insulator is positioned within said second insulator, adjacent said silicon film.

14. The method in claim 8, wherein said first insulator is patterned such that said first insulator is positioned within said second insulator, adjacent said substrate.

15. The method in claim 8, wherein said first insulator and said second insulator form an insulating layer that electrically isolates said substrate from said silicon film.

16. A method of forming a silicon-over-insulator (SOI) integrated circuit structure comprising:

forming a substrate having first and second portions;

depositing a first insulator over said substrate;

patterning said first insulator such that said first insulator remains only over said first portion;

depositing a second insulator over said substrate, wherein said first insulator has different thermal dissipation characteristics than said second insulator, wherein said first insulator is patterned such that said first insulator and said second insulator are formed adjacent one another;

polishing said first insulator and said second insulator to form a planar surface; and attaching a silicon film over said first insulator and said second insulator, such that said silicon film is separated from said substrate only by said first and second insulators.

17. The method in claim 16, wherein said first insulator has a different dielectric constant than said second insulator.

18. The method in claim 16, wherein said first insulator has higher thermal dissipation than said second insulator and said first insulator has a higher dielectric constant than said second insulator, and said method further comprising forming first devices in said silicon film over said first insulator and second devices in said silicon film over said second insulator, wherein said first devices generate more heat than said second devices, and said second devices require higher electrical permitivity than said first devices.

19. The method in claim 16, wherein said polishing forms a single planar surface upon which said silicon film is positioned.

20. The method in claim 16, wherein said first insulator and said second insulator form an insulating layer that electrically isolates said substrate from said silicon film.

* * * * *